United States Patent
Tsai et al.

(10) Patent No.: US 10,784,872 B1
(45) Date of Patent: Sep. 22, 2020

(54) FRACTIONAL REALIGNMENT TECHNIQUES FOR PLLS

(71) Applicant: Taiwan Semiconductor Manufacturing Company Limited, Hsinchu (TW)

(72) Inventors: Tsung-Hsien Tsai, Taoyuan (TW);
Ruey-Bin Sheen, Taichung (TW);
Chih-Hsien Chang, New Taipei (TW);
Cheng-Hsiang Hsieh, Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/572,660

(22) Filed: Sep. 17, 2019

(51) Int. Cl.
*H03L 7/081* (2006.01)
*H03L 7/18* (2006.01)
*H03L 7/085* (2006.01)
*H03L 7/099* (2006.01)

(52) U.S. Cl.
CPC .............. *H03L 7/081* (2013.01); *H03L 7/085* (2013.01); *H03L 7/099* (2013.01); *H03L 7/1806* (2013.01)

(58) Field of Classification Search
CPC ......... H03L 7/081; H03L 7/085; H03L 7/099; H03L 7/1806
USPC ............................ 327/147–163; 375/373–376
See application file for complete search history.

(56) References Cited

U.S. PATENT DOCUMENTS

| | | | | |
|---|---|---|---|---|
| 2012/0112809 A1* | 5/2012 | Zhu | ....................... | H03L 7/1976 327/157 |
| 2013/0033293 A1* | 2/2013 | Zhang | ................... | H03L 7/1976 327/156 |
| 2013/0278303 A1* | 10/2013 | Chen | ...................... | H03L 7/085 327/117 |
| 2018/0097523 A1* | 4/2018 | Hoshyar | .................. | H03L 7/16 |

* cited by examiner

*Primary Examiner* — Tomi Skibinski
(74) *Attorney, Agent, or Firm* — Jones Day

(57) ABSTRACT

Systems, methods, and devices for fractional realignment are disclosed herein. A feedback divider generates a feedback dividing clock signal based on a controlling oscillator frequency. A delta-sigma modulator is coupled to the feedback divider and generates a dividing ratio to the feedback divider. An accumulating phase adjustor is coupled to the delta-sigma modulator and (i) determines a difference between a frequency tuning word (FCW) and the dividing ratio and (ii) generates a coarse tuning word and a fine tuning word. A digital-to-time converter (DTC) is coupled to the accumulating phase adjustor and generates a first clock frequency based on a reference clock frequency, the coarse tuning word and the fine tuning word. A realignment pulse generator is coupled to the DTC and generates a realignment clock based on the first clock frequency having a period that is the same as a period of the controlling oscillator frequency.

20 Claims, 13 Drawing Sheets

FRACTIONAL REALIGNMENT TECHNIQUES FOR PLLS

FIELD

The technology described in this disclosure relates generally to electronic systems and more particularly to phase-locked loop (PLL) circuits.

BACKGROUND

A PLL is an electronic circuit that generates an output signal having a phase that is related to an input signal. PLLs are used in a number of different applications such as radio, telecommunications, and other electronic applications that process a signal containing noise. For example, PLLs can be used to generate, stabilize, demodulate, filter, or recover a signal after it has passed through a noisy communications channel. Two types of PLL operational modes include fractional-N and integer-N. Fractional-N mode generates an output signal having frequency that is a fractional portion of a reference frequency. Integer-N mode generates an output signal having a frequency that is a multiple of a reference frequency. Realignment is a technique that can improve the phase noise performance of a PLL.

Traditional realignment is limited at the integer-N operation. Such realignment uses a realignment clock that is generated from a PLL reference clock. Because the PLL reference clock is used, the realignment clock has same period as reference clock. Use of the traditional realignment technique to fractional-N mode results in a locking behavior. When the PLL operates at fractional-N mode, however, the ratio of the reference clock and oscillator clock is a fraction rather than an integer. If, in fractional-N mode, the realignment clock is forced to inject a signal into the oscillator, the phase noise of PLL will be damaged during realignment operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
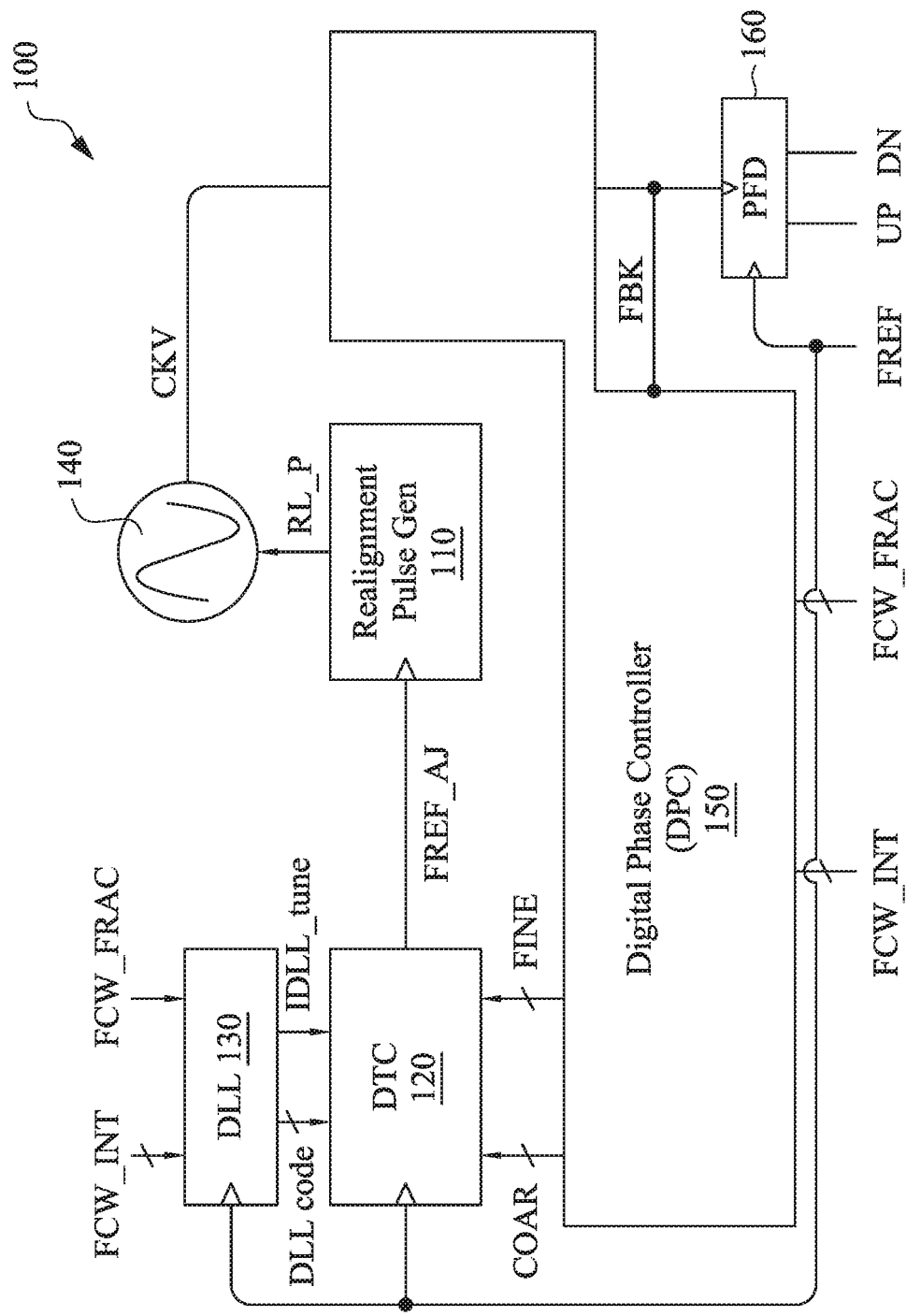
FIG. 1 illustrates an exemplary PLL in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Traditionally, with a PLL operating in fractional-N mode, the phase of the oscillator traces the reference clock, but does not perfectly align with the reference clock due to limited bandwidth of the PLL. Additionally, traditional realignment only operates in integer N mode because the source of realignment clock comes from reference clock. If the realignment clock is forced to inject a signal into the oscillator, the period of the oscillator is distorted which impacts performance of the PLL. As described in detail herein, a new realignment clock, $RL_P$, can be generated that has the same period as a feedback dividing clock generated by a reference clock. This realignment clock, $RL_P$, is used during fractional-N mode. The realignment clock, $RL_P$, uses a period that is duplicated from the feedback dividing clock. The ratio of this new realignment clock, $RL_P$, and the oscillator clock is an integer, which provides for improved phase noise of PLL during fractional-N mode.

Figure 5:
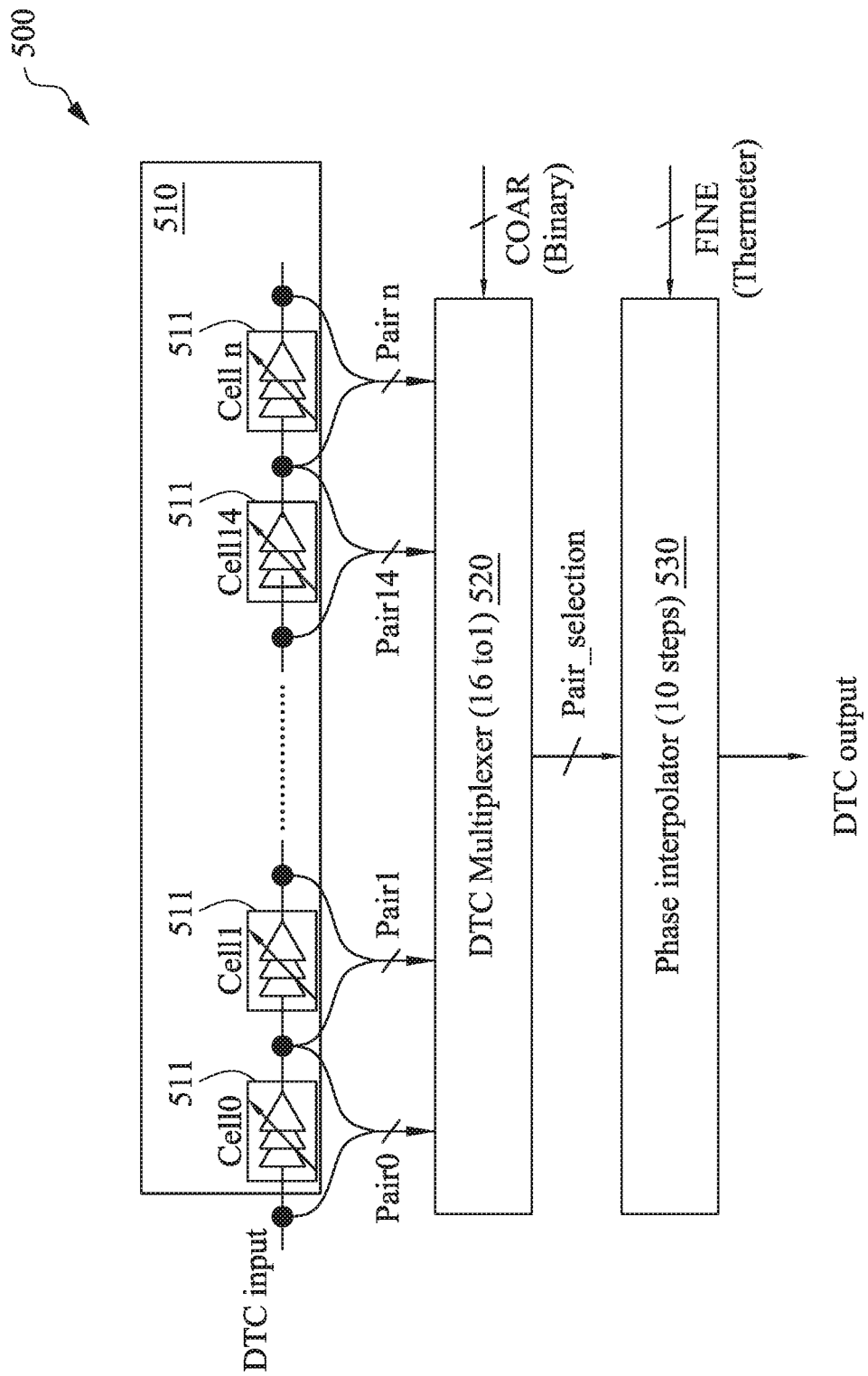
FIG. 5 illustrates an exemplary digital-to-time converter in accordance with various embodiments of the present disclosure.

FIG. 1 illustrates an exemplary PLL 100 in accordance with various embodiments of the present disclosure. PLL 100 includes a realignment pulse generator 110, a digital-to-time converter (DTC) 120, a delayed-locked loop (DLL) 130, an oscillator 140, a digital phase controller (DPC) 150, and a phase frequency detector (PFD) 160. Together, DLL 130 and DPC 150 can generate a new clock frequency, $FREF_{AJ}$, that is duplicate a period of the feedback dividing clock signal, FBK, using the reference signal, FREF, as a source. The clock frequency is provided to a realignment pulse generator 110 to generate a realignment pulse signal, $RL_P$, which has a period that aligns with that of controlling oscillator frequency, CKV, of oscillator 140. DLL 130 is used to find the period of oscillator 140 for a delay unit of DTC 120, as described in more detail in FIG. 5. A delay unit of DTC 120, as described in FIG. 5, is duplicated from DLL 130 for a remote control, and thus the delay time of the delay unit in DTC 120 is modified with DLL 130 when the period of oscillator 140 is changed.

During PLL operation in fractional-N mode, DPC 150 provides a number of feedback dividing clock signals, FBK, which on average generate a fractional signal. The period ratio of oscillator 140 and the reference signal, FREF, is integer, but the period ratio of oscillator 140 and reference clock FREF is fraction. DPC 150 identifies and accumulates the difference between a frequency tuning word (FCW) and signals within DPC 150. A controlled word to DTC 120 is generated by DPC 150. DTC 120 adjusts the period of reference clock, FREF, based on the controlled word from DPC 150.

Figure 2:
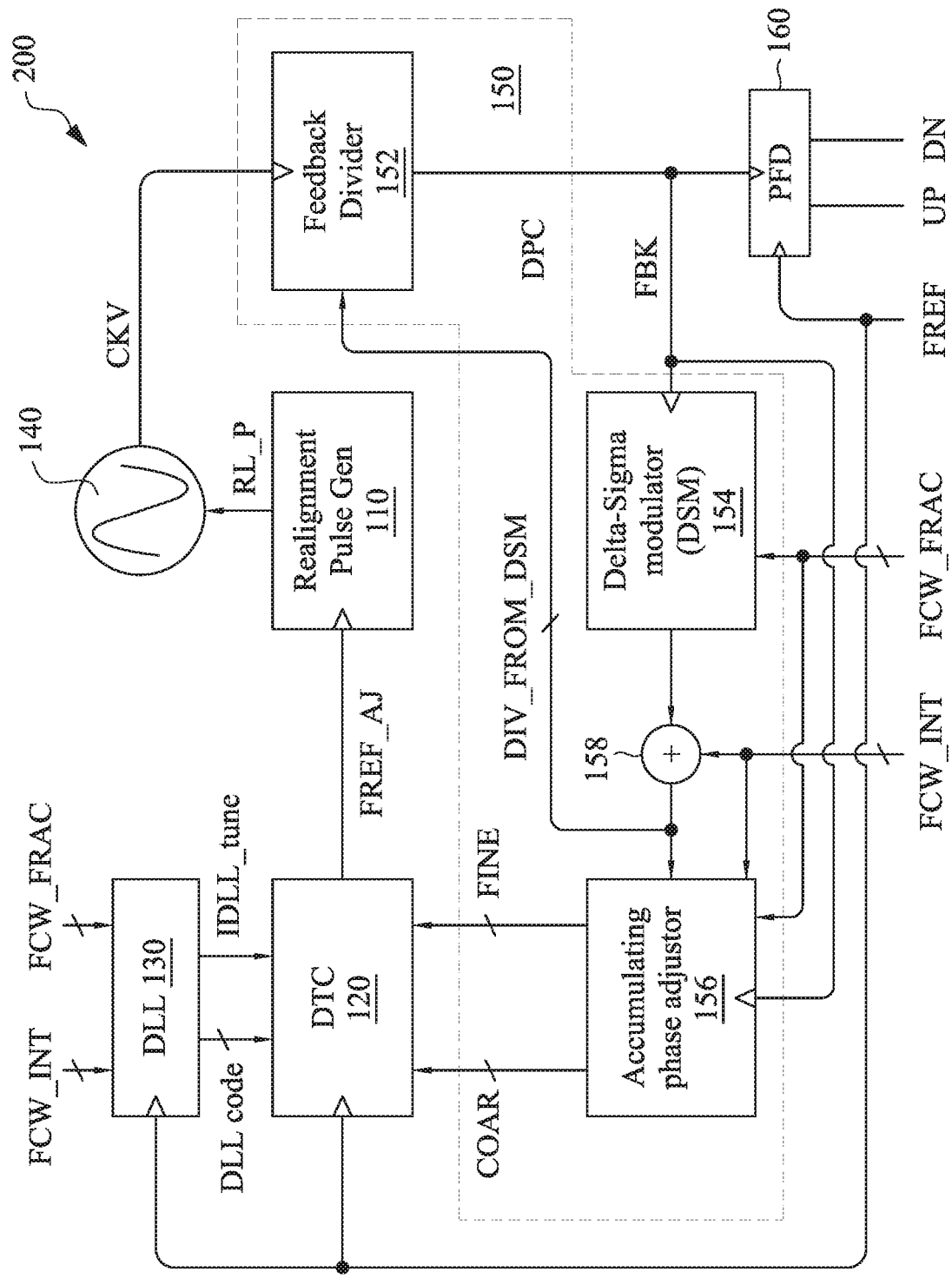
FIG. 2 illustrates an exemplary PLL in accordance with various embodiments of the present disclosure.

FIG. 2 illustrates an exemplary PLL 200 in accordance with various embodiments of the present disclosure. DPC 150 includes a feedback divider 152, delta-sigma modulator (DSM) 154, accumulating phase adjuster 156, and an adder 158. DSM 154 receives external frequency control words, FCW, having an integer component, $FCW_{INT}$, and a fractional component, $FCW_{FRAC}$. During fractional-N mode, DSM 154 provides different dividing ratios to the feedback divider 152 to generate an average fractional feedback dividing clock signal, FBK. The period ratio of oscillator 140 and reference clock, FREF, is integer but the period ratio of oscillator 140 and reference clock, FREF, is fraction. The accumulated phase adjustor 156 identifies and accumulates the difference between FCW (e.g., $FCW_{INT}$ and $FCW_{FRAC}$) and dividing ratio of DSM 154. Tuning words are generated by accumulating phase adjuster 156 and provided to DTC 120. DTC 120 adjusts the period of reference clock, FREF, based upon the tuning words, COAR and FINE, from the accumulated phase adjustor 156.

Feedback divider 152 is driven by a controlling oscillator frequency, CKV, of oscillator 140. With the controlling oscillator frequency, CKV, feedback divider 152 generates a feedback dividing clock signal, FBK. DSM 154 is driven by the feedback dividing clock signal, FBK, and receives a fractional part of a frequency control word, FCW, (e.g., $FCW_{FRAC}$) to generate 4 different levels of signals (e.g., +2, +1, 0, −1). A combination (e.g., DIV_FROM_DSM) of an output from DSM 154 and an integer part of FCW, FCW_INT, is provided as input into both feedback divider 152 and accumulated phase adjuster 156. The period of the feedback dividing clock signal, FBK, is controlled by the output pulses of DSM 154 and an integer portion of the frequency control word, $FCW_{INT}$ (e.g., DIV_FROM_DSM). Feedback divider 152 generates a different frequency of feedback dividing clock signal, FBK, based on the output of DSM 154. Accumulated phase adjustor 156 receives a number of inputs including feedback dividing clock signal, FBK, a frequency control word, $FCW_{INT}$ and $FCW_{FRAC}$, and DIV_FROM_DSM, and provides coarse tuning words, COAR, and fine tuning words, FINE, to DTC 120. DTC 120 is driven by a reference frequency, FREF, provided by reference clock of PLL 200 (not shown). DTC 120 also receives remote setting words, DLL code, and tuning words, IDLL_tune, from DLL 130. DLL 130 is a pseudo-DLL that can provide precision phase skew with a short delay train for covering a wide range interval. The phase skew of the input of DLL 130 is a programmable latency (e.g., a period of the controlling oscillator frequency, CKV) after locking. The operational frequency of DLL 130 is the same as the reference clock, FREF. Coarse and fine tuning words, COAR and FINE, are also provided to DTC 120. DTC 120 includes a delay unit, described in FIG. 5, that is programmed using the tuning words, COAR and FINE, so that the delay time of a delay unit is same as the period of oscillator 140. The coarse tuning words, COAR, are used to select the output of delay stages. The fine tuning words, FINE, are used to select a fractional delay time from a delay stage. DTC 120 generates a new clock signal, e.g., $FREF_{AJ}$. This new clock signal has the same quality as the reference clock (not shown) of PLL 200 and also has same period as feedback dividing clock signal, FBK. Realignment pulse generator 110 coverts the new clock signal, $FREF_{AJ}$, to a new realignment clock signal, $RL_P$, that has a narrow pulse width for the oscillator 140. DLL 130 is also driven by the reference signal, FREF, and controlled by frequency control words, $FCW_{INT}$ and $FCW_{FRAC}$, to find the same delay time as the period of oscillator 140.

Figure 3:
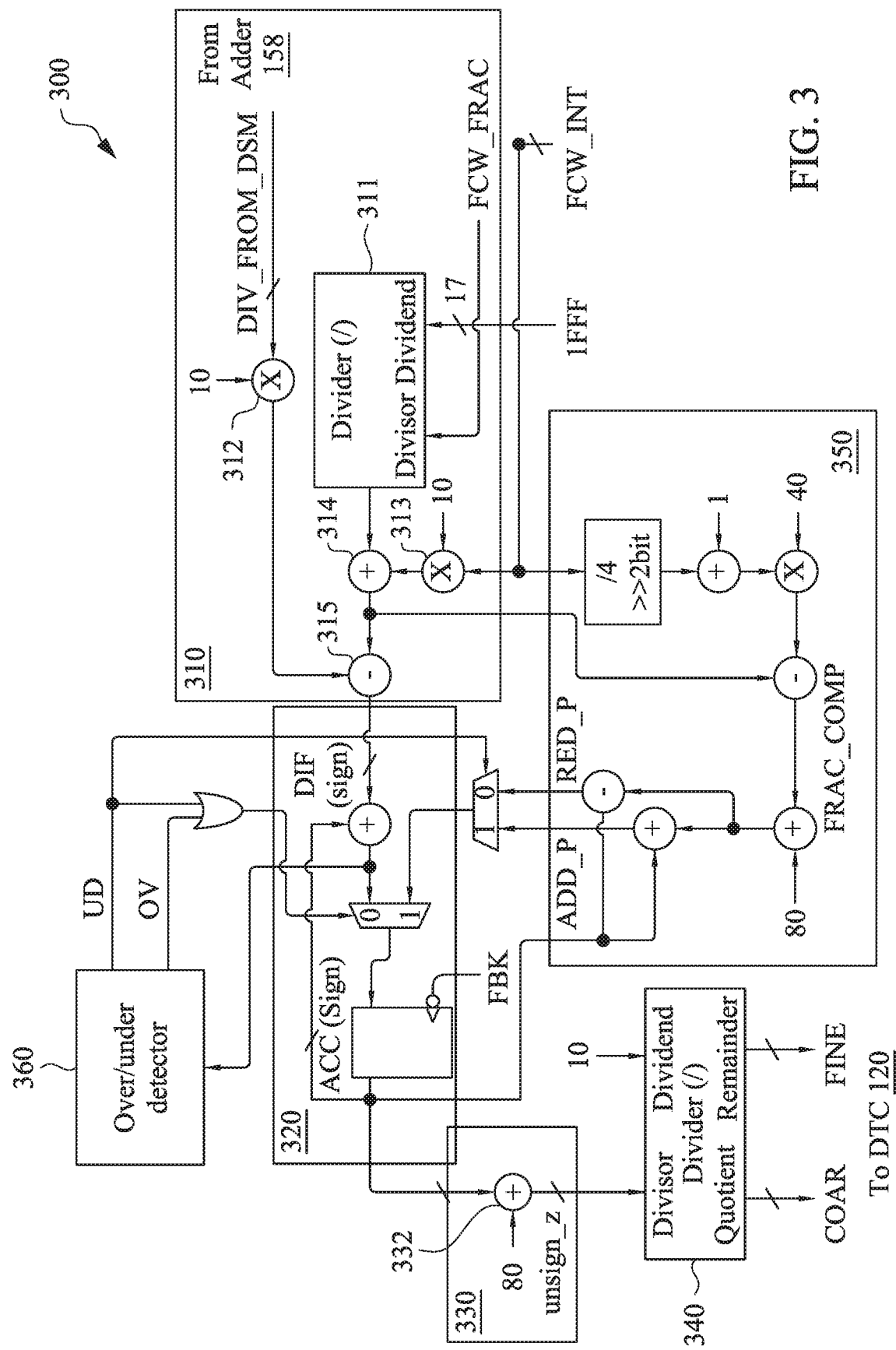
FIG. 3 illustrates an exemplary accumulated phase adjustor in accordance with various embodiments of the present invention.

FIG. 3 illustrates an exemplary accumulated phase adjustor 300 in accordance with various embodiments of the present invention. The behavior of accumulated phase adjustor 300 is characterized by the following equation:

$$ACC_n = ACC_{n+1} + (DIV\_FROM\_DSM_n - FCW) \qquad (1)$$

where n represents time, ACC is the output of accumulated phase adjustor 300, DIV_FROM_DSM is the combined output of DSM 154 and $FCW_{INT}$, and FCW is the combination of an integer part, $FCW_{INT}$, and fractional part, $FCW_{FRAC}$, of frequency tuning word. Accumulated phase adjustor 300 includes a fraction subtraction block 310, an accumulator block 320, a sign-to-unsign block 330, a decoder block 340, a reset block 350, and overflow/underflow detector 360. Fraction subtraction block 310 identifies the difference between DIV_FROM_DSM and FCW and provides the difference to accumulator 320. Fraction subtraction block 310 provides a pure integer, DIV, to accumulator 320. Accumulator 320 collects timing for every operational cycle of PLL 200.

Fraction subtraction block 310 includes a divider 311, multipliers 312, 313, an adder 314, and a subtracter 315. Divider 311 operates only on system startup, taking in the fractional component of the frequency tuning word, $FCW_{FRAC}$. The output of divider 311 is provided to adder 314 which takes a tens multiple of the output of reset block 350. The output from adder 314 is combined with a tens multiple of DIV_FROM_DSM provided by adder 158 of DPC 150.

DIV_FROM_DSM is generated at the rising edge of the feedback dividing clock signal, FBK, and accumulator 320 is driven by the falling edge of the feedback dividing clock signal, FBK. In order to provide the tuning words to DTC 120 before the next rising edge of the feedback dividing clock signal, FBK, a sign-to-unsign block 330 is between accumulator 320 and decoder 340. In other words, accumulator 320 provides DTC 120 with sufficient settling time before the next rising edge. If there is a negative time delay in DTC 120, then the middle stage of DTC 120 stands for the zero digit of the output of accumulator 320. For example, DTC 120 includes a total of sixteen (16) stages, with the middle stage being eight (8). The eighth stage of DTC 120 represents a time delay of "0," the seventh stage represents time delay of "−1," and the ninth stage represents a time delay of "1." Decoder 340 analyzes the output of sign-to-unsign block 330. Sign-to-unsign block 330 includes an adder component 332 which receives a constant adjustment of +80 along with the signed accumulator signal, ACC, from accumulator 320. The constant adjustment is transferred to the tuning words, more specifically, the quotient "8" is transferred to the coarse tuning word, COAR, and the remainder "0" is transferred to the fine tuning word, FINE by following the decoder block 340. In other words, the tens digit of the constant adjustment +80 stands for the coarse tuning word, COAR, of DTC 120 and the ones digit stands for the fine tuning word, FINE, of DTC 120. Decoder block 340 includes a divider and a binary2thermometer. Decoder block 340 translates the tuning words provided to DTC 120.

Figure 4:
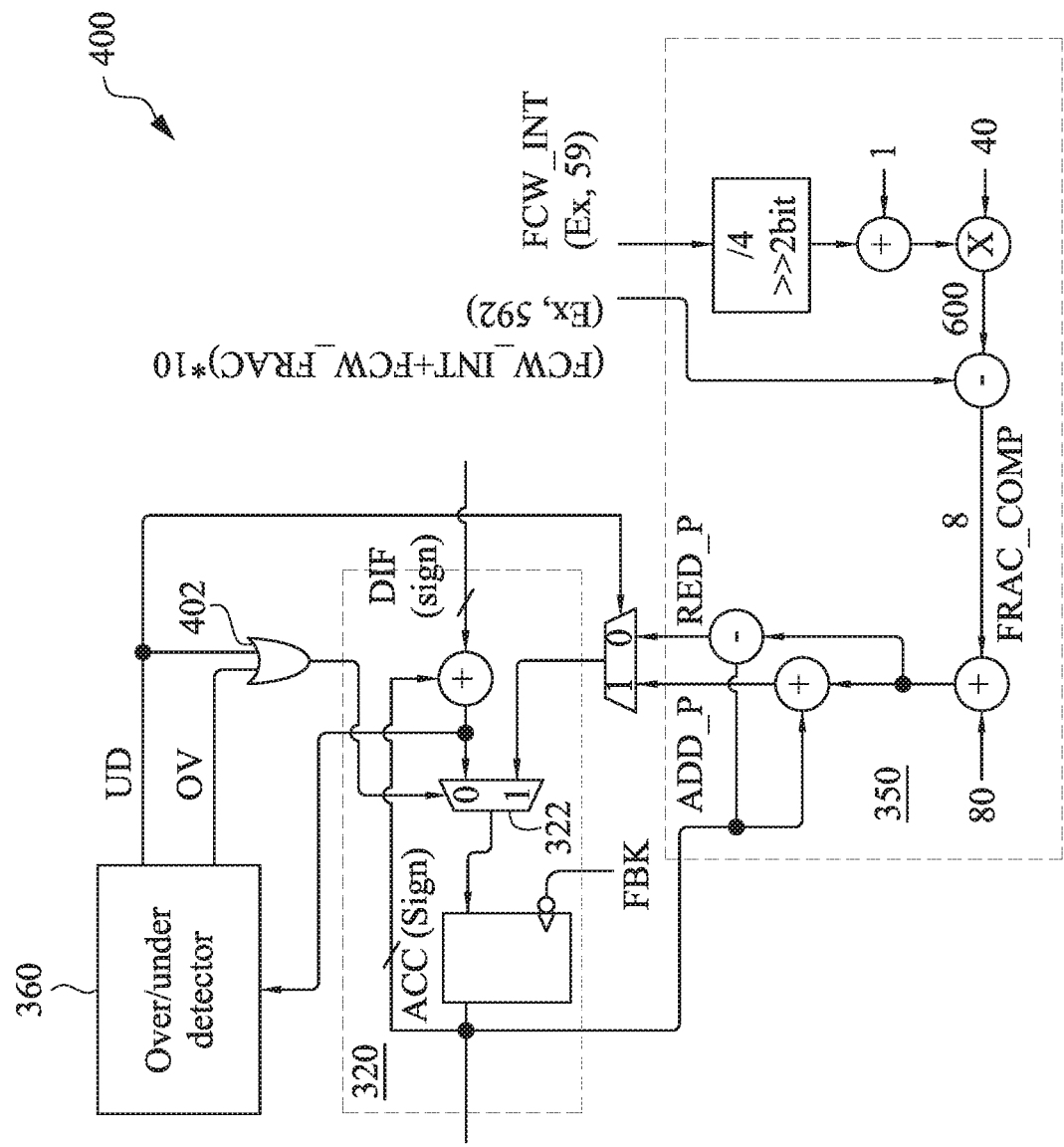
FIG. 4 illustrates an exemplary protection circuit in accordance with various embodiments of the present disclosure.

FIG. 4 illustrates an exemplary protection circuit 400 in accordance with various embodiments of the present disclosure. Protection circuit 400 includes reset block 350 and the overflow/underflow detector 360. The protection circuit prevents 400 accounts for the occurrence of overflow or underflow of accumulator 320. Overflow and underflow of accumulator 320 is inevitable. Such occurrence, however, can cause unpredictable jitter and/or frequency jumps at the transition edges due to edge misalignment. More specifically, when overflow or underflow occurs, accumulator 320 provides an incorrect tuning word to DTC 120. The incorrect tuning word can cause a failure in alignment between realignment clock signal, $RL_P$, and the controlling oscillator frequency, CKV. Such failure is illustrated and discussed in FIG. 9A. Reset block 350 detects overflow and underflow and addresses such event by setting "pre-set code" into accumulator 320 to ensure phase alignment at the transition.

Overflow/underflow detector 360 receives the signals of the accumulator 320 before sampling and sends a signal to reset block 350 and accumulator 320 if overflow or underflow occurs. The use of "+" adders within FIG. 4 addresses underflow and the use of "−" subtracters within FIG. 4 addresses overflow. Overflow/underflow detector 360 provides two signal outputs (e.g., underflow signal UD and overflow signal OV) to a logic gate 402 (e.g., OR gate). If either overflow or underflow is present, logic gate 401 will trigger operation of multiplexer 322 within accumulator 320. Multiplexer 322 receives a combination of a signed difference signal, $DIF_{sign}$, and a signed accumulation signal, $ACC_{sign}$. The signed difference signal can be represented by the following expression:

$$DIF_{sign} = (FCW_{INT} + FCW_{FRAC}) * 10 \quad (2)$$

Reset block 350 injects a "pre-set code" to accumulator 320 to replace the existing numerals of accumulator 320. This "pre-set code" aligns realignment clock signal, $RL_P$, and the controlling oscillator frequency, CKV, as shown and described in more detail in FIG. 9B. The "pre-set code" operation is characterized by the following equation:

$$ACC_n = ACC_{n+1} + \left\{ \left[ \left[ \text{Round\_down}\left(\frac{FCW_{INT}}{4}\right) + 1 \right] * 40 + (FCW_{INT} + FCW_{FRAC}) * 10 \right] + 80 \right\} \quad (3)$$

As shown in Equation 3 the "pre-set code" results in a difference between the period of reference clock, FREF, and an integer of the period of the controlling oscillator frequency, CKV, of oscillator 140. For example, if the frequency of reference clock, FREF, is approximately 250 MHz and the controlling oscillator frequency, CKV, of oscillator 140 is approximately 14.8 GHz, the period of reference clock, FREF, is approximately 59.2 periods of oscillator 140. If an integer of controlling oscillator frequency, CKV, of oscillator 140 is 60, the "pre-set code" calculated using Equation (3) is approximately 88 (e.g., 600−592+80). The positive "pre-set code" is accumulated with existed cumulative digits in the accumulator 320 if underflow occurs. Alternatively, if overflow occurs, the negative "pre-set code" is accumulated by accumulator 320.

FIG. 5 illustrates an exemplary DTC 500 in accordance with various embodiments of the present disclosure. The period of realignment clock, $RP_L$, is trimmed from the reference clock, FREF, based on the digital controlled or tuning words, COAR and FINE, provided by accumulating phase adjustor 156. The trimming amount includes both an integer component and a fraction component. DTC 500 includes a delay train 510, a clock multiplexer 520, and a phase interpolator 530. Together, the combination of clock multiplexer 520 and phase interpolator 530 in DTC 500 is a fractional interval selector. Delay train 510 includes a number of delay elements 511 (e.g., $cell_0$, $cell_1$, ..., $cell_n$). Latency of delay elements 511 is programmed to a period of the controlling oscillator frequency, CKV, (e.g., approximately 67.56 ps). In embodiments having sixteen (16) delay elements 511, for example, the delay train 510 covers a range of approximately 1081 ps. The unit of delay train is duplicated from the delay elements of DLL 130. The stage number of delay train 510 is determined by the system. The input and output of each delay element 511 are packaged as an input of the clock multiplexer 520. For example, the input and output of cello are packaged as pairo and provided as the first input of clock multiplexer 520. The latency of each delay element 511 is the same as the controlling oscillator frequency, CKV, of oscillator 140. As a result, the clock multiplexer 520 selects an integer multiple of the period of controlling oscillator frequency, CKV, of oscillator 140. The pair outputs of clock multiplexer 520 (e.g., Pair_selection) are connected to the input of phase interpolator 530. Phase interpolator 530 determines a fractional interval of the pair_selection as described in more detail in FIG. 10.

Figure 6A:
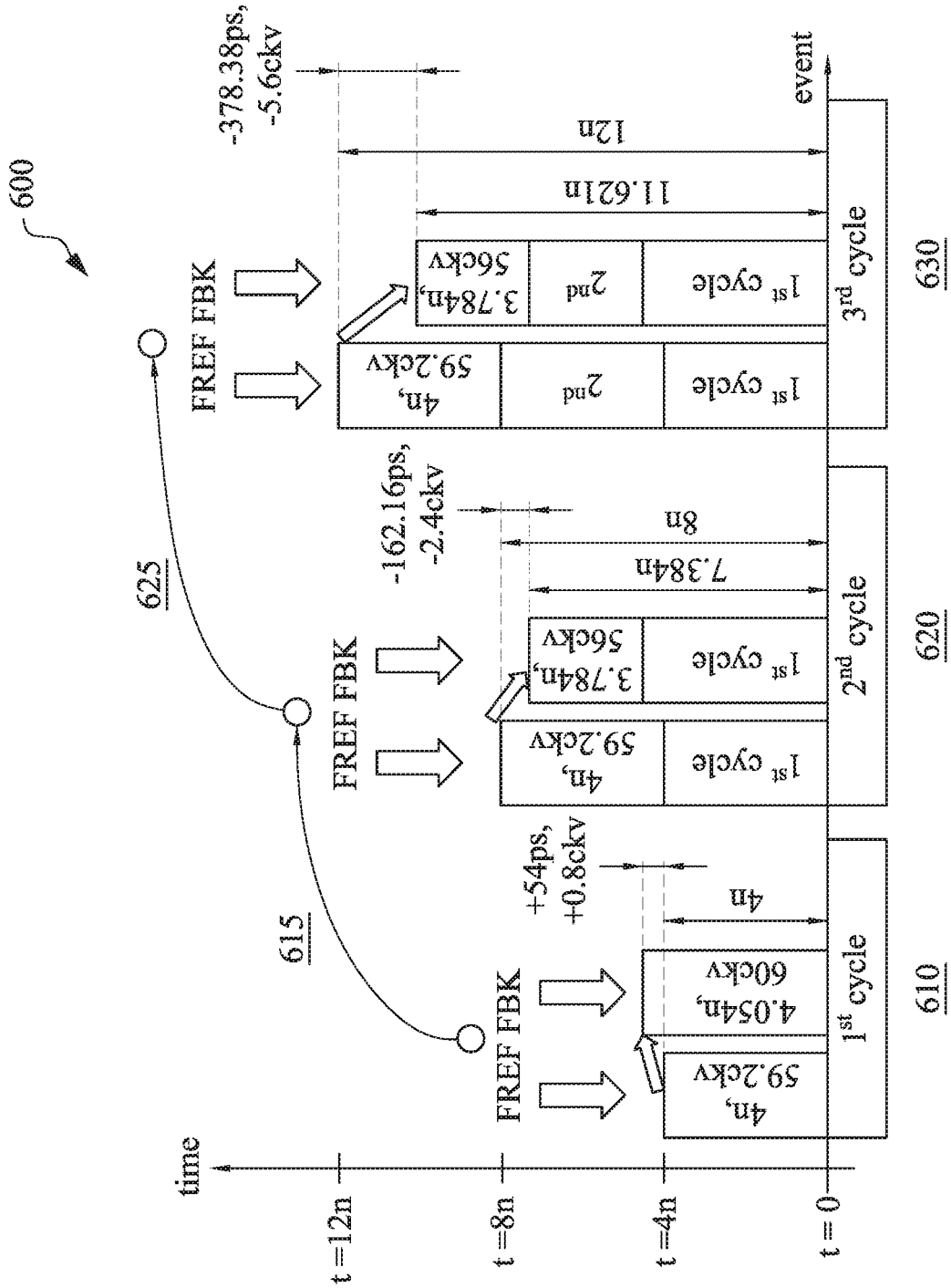
FIG. 6A illustrates an exemplary phase relationship between a reference clock signal, FREF, and a feedback dividing clock signal, FBK, of FIG. 2 for period adjustment.

FIG. 6A illustrates an exemplary phase relationship between a reference clock signal, FREF, and a feedback dividing clock signal, FBK, of FIG. 2 for period adjustment. In fractional-N mode, DSM 154 generates dividing words, DIV_FROM_DSM, and provides that to feedback divider 152. On average, after a number of cycles, DIV_FROM_DSM results in a fraction. For example, FIG. 6A illustrates a plot 600 illustrating three operational cycles (e.g., $1^{st}$ cycle 610, $2^{nd}$ cycle 620, and $3^{rd}$ cycle 630) occurring over time (e.g., the y-axis). The left-most bar within each cycle represents the reference clock signal, FREF, and the right-most bar within each cycle represents the feedback dividing clock signal, FBK, from feedback divider 152. As time progresses between each operational cycle, the signals accumulate. For example, in the example case illustrated in FIG. 6A, during the $1^{st}$ cycle 610 the reference clock frequency, FREF, is approximately 250 MHz with period of approximately 4 ns, which is equivalent to approximately 14.8 GHz or 59.2 CKV (e.g., 59.2 times the controlling oscillator frequency, CKV). During the $1^{st}$ cycle 610, the period of the feedback dividing clock signal, FBK, and the reference clock frequency, FREF, is approximately 60 CKV (e.g., 59.2 times the controlling oscillator frequency, CKV) with a period of approximately 4.054 ns and 4 ns, respectively. In order to align the frequencies between the reference clock signal, FREF, and the feedback dividing clock signal, FBK, the reference frequency, FREF, needs to increase by approximately 0.8 CKV with a period increase of approximately 54 ps (e.g., accumulated timing). The accumulated timing of approximately +0.8 CKV is stored in accumulating phase adjustor 156 and applied to subsequent cycles (e.g., accumulation 615, 625). During the $2^{nd}$ cycle, the reference frequency, FREF, accumulated time is 8 ns (e.g., 4 ns from the $1^{st}$ cycle 610 and 4 ns from the 2nd cycle 620), and the accumulated period is approximately 118.4 CKV. However, with the feedback dividing clock signal, FBK, period is approximately 56 CKV. In order for the reference frequency, FREF, and the feedback dividing clock signal, FBK, to align, the period of the feedback dividing clock signal, FBK, needs to be reduced by approximately 2.4 CKV. This reduction is stored in accumulating phase adjustor 156 and applied to subsequent cycles. However, "–2.4 ckv" is generated by dividing ratios minus the frequency control word, FCW, and the previous accumulated signal, ACC, generated by accumulator 320. During the $3^{rd}$ cycle, the reference frequency, FREF, accumulation time is 12 ns (e.g., 4 ns from the $1^{st}$ cycle 610, 4 ns from the $2^{nd}$ cycle 620, 4 ns from the $3^{rd}$ cycle 630), and the accumulated period is approximately 177.6 CKV. However, with the feedback dividing clock signal, FBK, period remains at approximately 56 CKV. In order for the reference frequency, FREF, and the feedback dividing clock signal, FBK, to align, the period of the feedback dividing clock signal, FBK needs to be reduced by approximately 5.6 CKV. This reduction is stored in accumulating phase adjustor 156 and applied to subsequent cycles. The ACC digits from accumulator 320 are translated to DTC code to generate a new realignment clock, $RL_P$, for oscillator realignment.

Figure 6B:
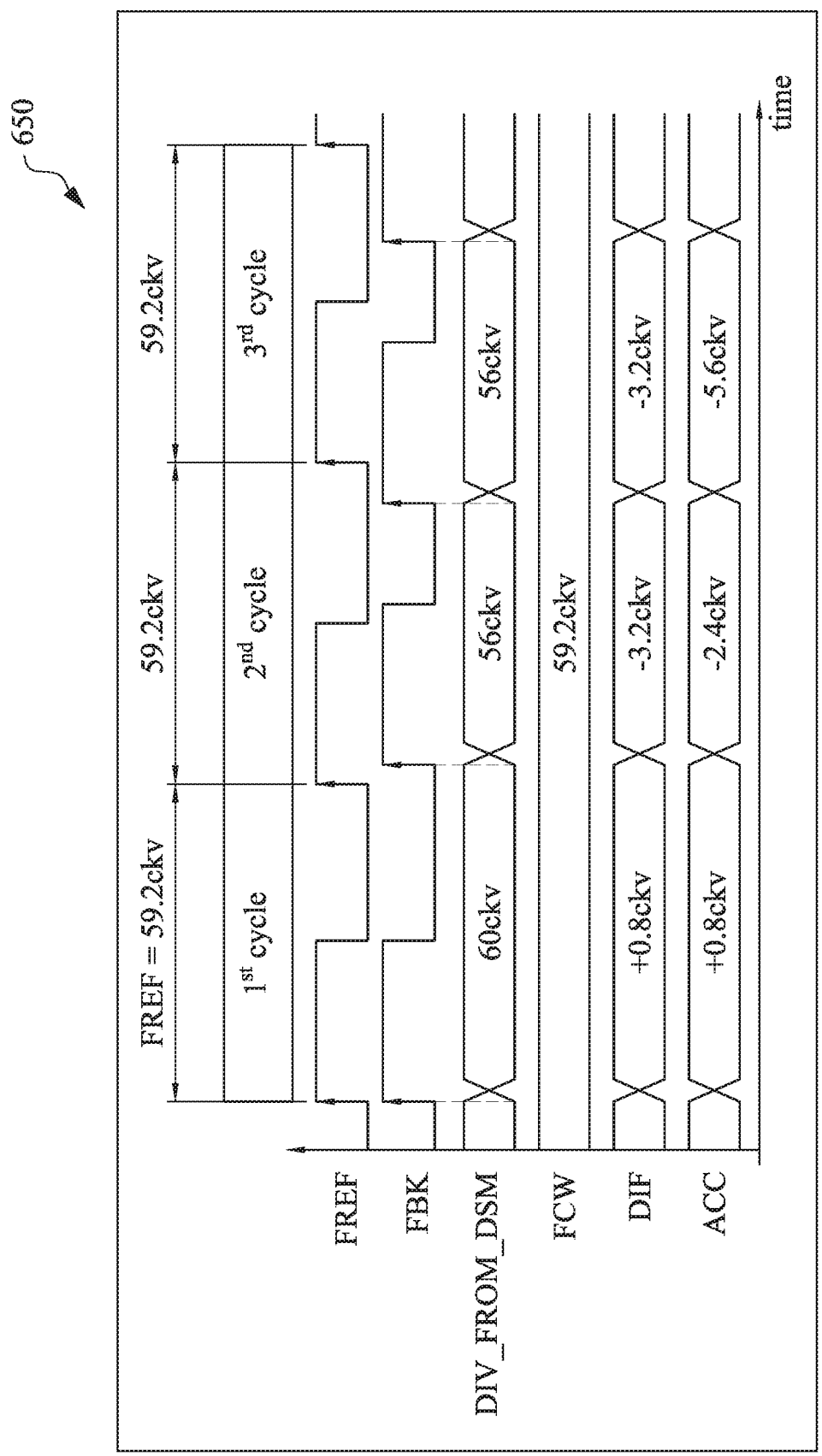
FIG. 6B illustrates an exemplary timing diagram of the controlling oscillator frequency, CKV, in the reference clock signal, FREF, and the feedback dividing clock signal, FBK, during the operation described in FIG. 6A.

FIG. 6B illustrates an exemplary timing diagram 650 of the controlling oscillator frequency, CKV, in the reference clock signal, FREF, and the feedback dividing clock signal, FBK, during the operation described in FIG. 6A. The x-axis of timing diagram 650 represents time and the y-axis represents the various signals described in FIGS. 2-3. As illustrated in FIG. 6B, when the corrections described in FIG. 6A are applied, the feedback dividing clock signal, FBK, is modified. During the $2^{nd}$ cycle, the feedback dividing clock signal, FBK, initially lags the reference clock signal, FREF. The signed difference signal, $DIF_{sign}$, described in FIG. 4 and Equation (2), represents the difference between the periods of the reference clock signal, FREF, and the feedback dividing clock signal, FBK.

Figure 7:
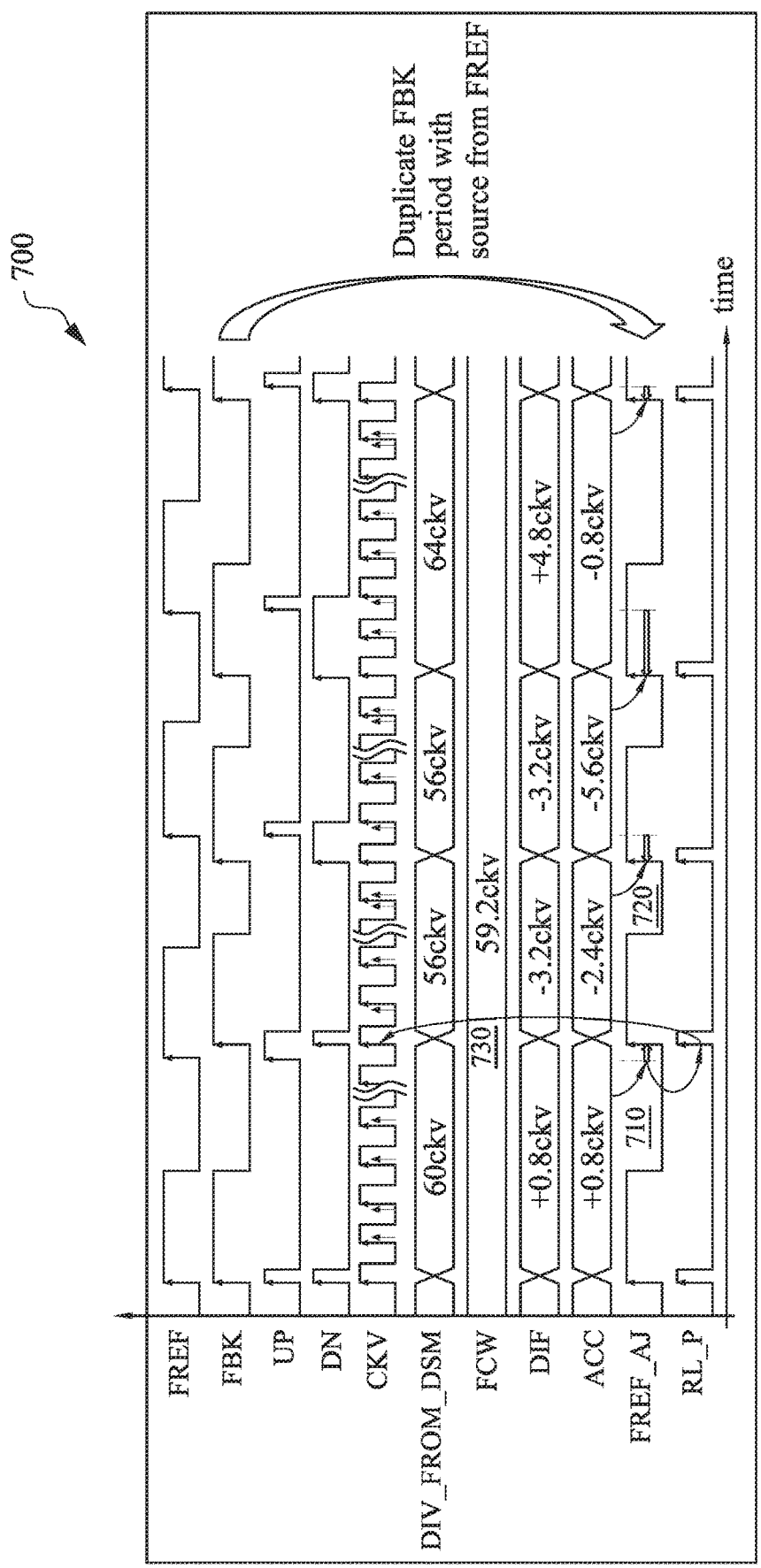
FIG. 7 illustrates an exemplary timing diagram of the PLL of FIG. 2 in accordance with various embodiments of the present disclosure.

Realignment clock, $RL_P$, is a tunable signal that can duplicate the period of the feedback dividing clock signal, FBK, which provides the realignment clock with an integer ratio of the controlling oscillator frequency, CKV, without distorting the period of CKV. FIG. 7 illustrates an exemplary timing diagram 700 of PLL 200 of FIG. 2 in accordance with various embodiments of the present disclosure. Timing diagram 700 has an x-axis that represents time and a y-axis that represents the various signals of PLL 200. As described in FIG. 2, DTC 120 generates a new clock signal, $FREF_{AJ}$, which is used to adjust the phase of a reference signal, FREF in real time. The period of clock signal, $FREF_{AJ}$, is duplicated from the feedback dividing clock signal, FBK. The accumulated signal, ACC, described in detail in FIGS. 6A-6B, is added to new clock signal $FREF_{AJ}$. For example, as annotated by operation 710, the clock signal from DTC 120, $FREF_{AJ}$, is shifted by the ACC period of approximately 0.8 CKV (e.g., the difference between the period of the reference signal, FREF, and the feedback dividing clock signal, FBK, of the $1^{st}$ cycle 610). For example, because the ACC signal is a signed signal, a positive signal of 0.8 CKV shifts the clock signal, $FREF_{AJ}$, by 0.8 to the right in time. Alternatively, a negative ACC signal of –2.4 CKV shifts the clock signal, $FREF_{AJ}$, by 2.4 to the left in time. The clock signal, $FREF_{AJ}$, is provided to realignment pulse generator 110 and generates a tunable realignment clock signal, $RL_P$, for aligning the phase of oscillator. As illustrated by operation 730, the realignment clock signal, $RL_P$, has a period that aligns with that of the controlling oscillator frequency, CKV.

Figure 8:
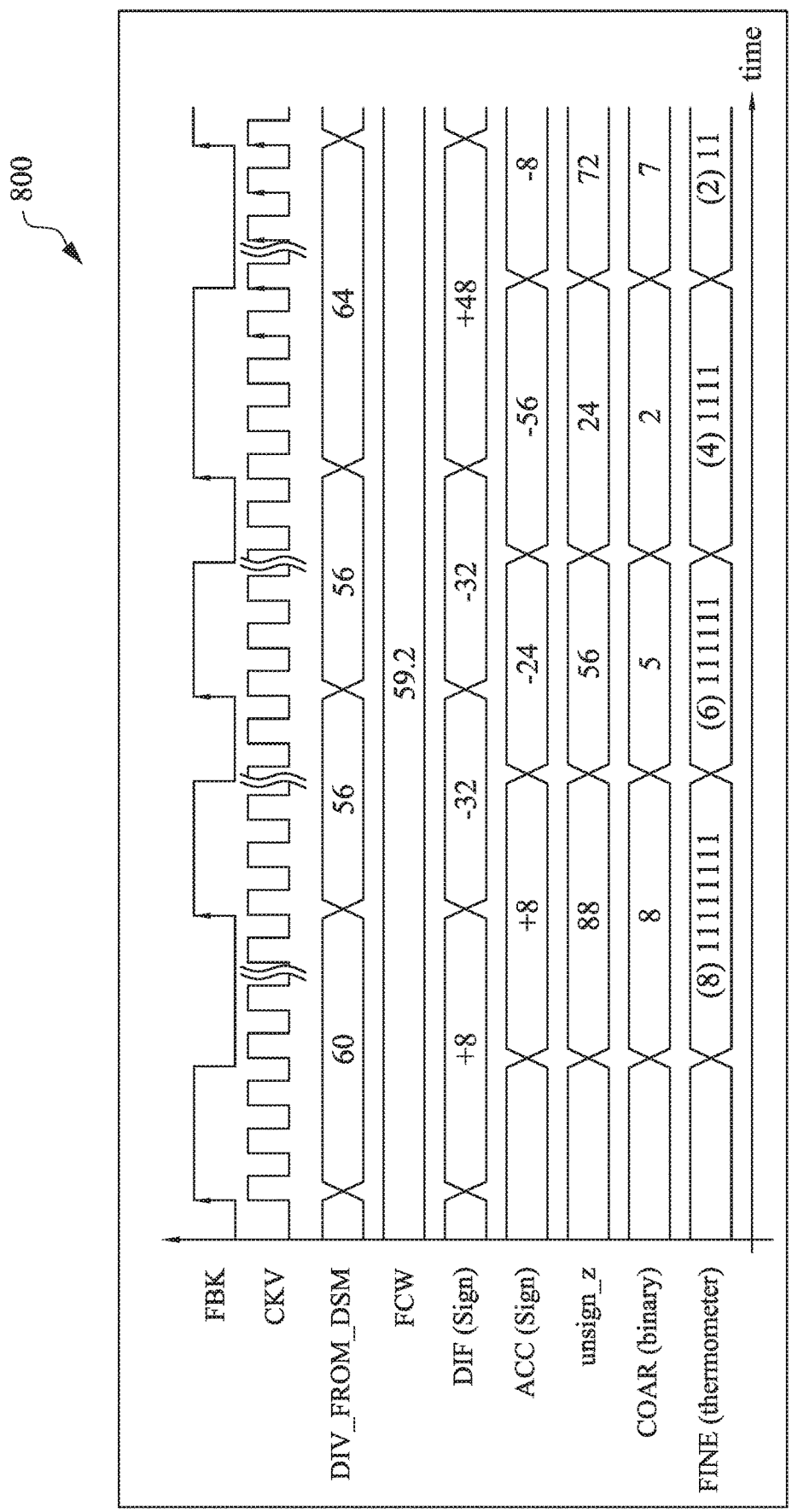
FIG. 8 illustrates an exemplary timing diagram of accumulating phase adjustor of FIG. 3 in accordance with various embodiments of the present disclosure.

FIG. 8 illustrates an exemplary timing diagram 800 of accumulating phase adjustor 300 of FIG. 3 in accordance with various embodiments of the present disclosure. Timing diagram 800 has an x-axis that represents time and a y-axis that represents the various signals of accumulated phase adjustor 300. DIF(sign) is generated after being processed by divider 311, multipliers 312, 313, adder 314, and subtractor 135. Due to the divider 311 of fraction subtraction block 310 only operating at system startup, it has a high precision. Accumulator 320, in turn, receives a pure integer from fraction subtraction block 310 and accumulates data at falling edge of the feedback dividing clock signal, FBK, to ensure the event of adjusting timing is ready before next rising edge. The timing of tuning period by DTC 120 must follow with the each dividing setting of each cycle provided from DSM 154 (e.g., DIV_FROM_DSM). If timing of DTC period tuning slips one cycle from DIV_FROM_DSM, the system fails. Tuning words COAR and FINE are generated from decoder 340 (e.g., which includes a small bits divider) because its operating interval, as illustrated in FIG. 8, is less than one half of the feedback dividing clock signal, FBK.

Figure 9A:
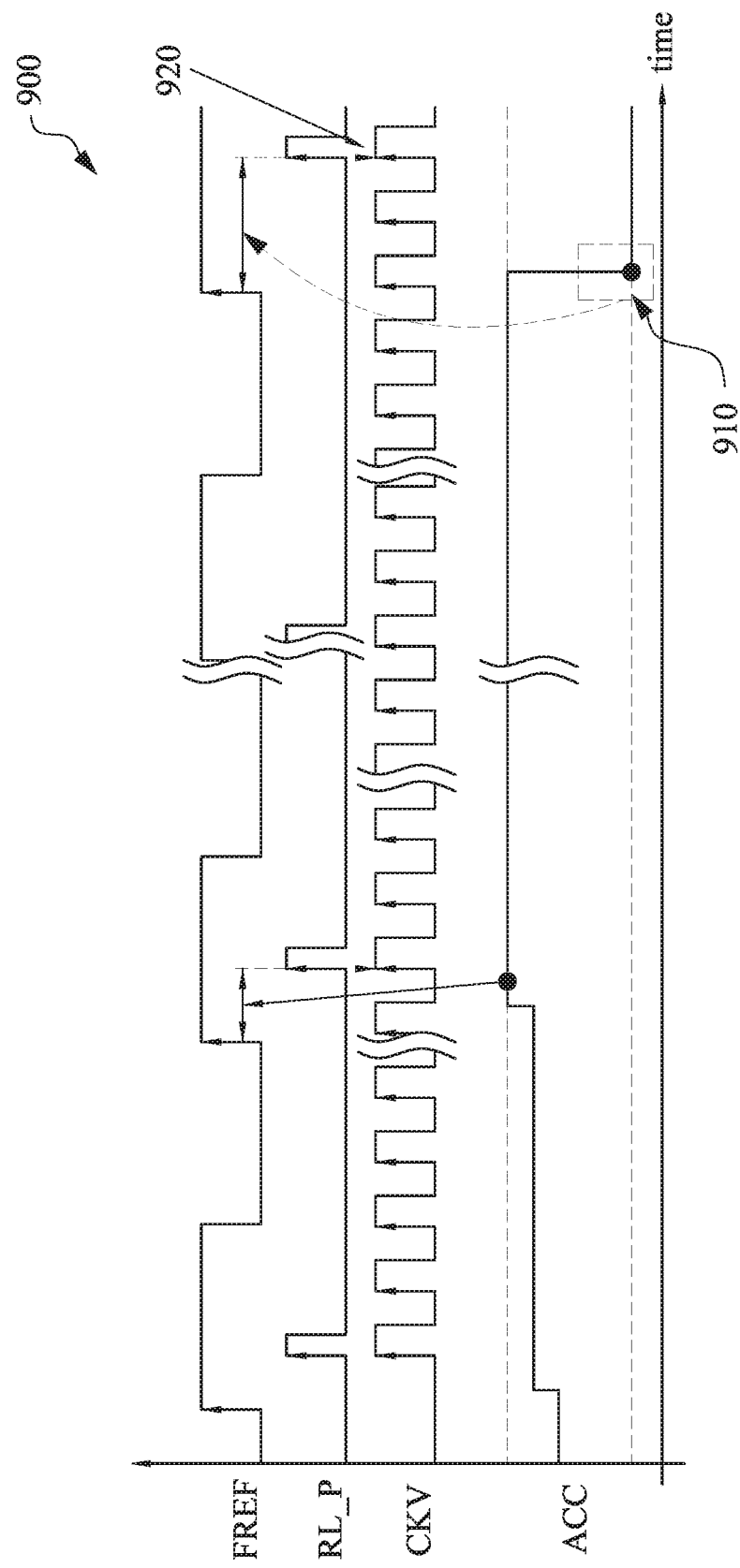
FIG. 9A illustrates an exemplary timing diagram of accumulator during an overflow or underflow in accordance with various embodiments of the present disclosure.

FIG. 9A illustrates an exemplary timing diagram 900 of accumulator 320 during an overflow or underflow in accordance with various embodiments of the present disclosure. Timing diagram 900 has an x-axis that represents time and a y-axis that represents the various signals of accumulator 320. At time 910, the accumulator 320 experiences either overflow or underflow and provides DTC 120 an incorrect tuning word. This incorrect tuning word, in turn, causes an edge misalignment, at time 920, between the controlling oscillator frequency, CKV, and the realignment clock signal, $RL_P$. The edge misalignment can cause unpredictable jitter and frequency jump within the realignment clock signal, $RL_P$.

Figure 9B:
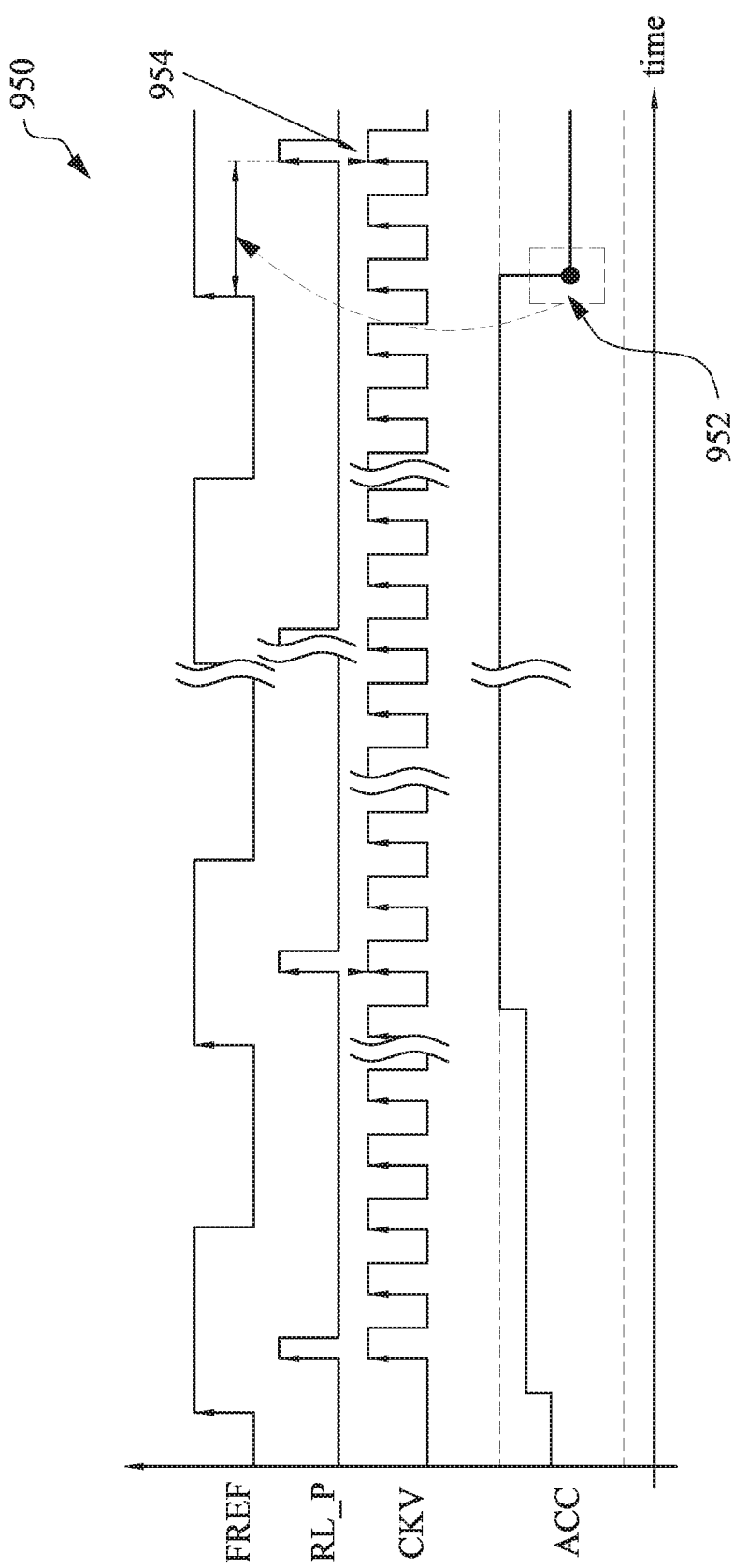
FIG. 9B illustrates an exemplary timing diagram of accumulator during an overflow or underflow after the injection of "pre-set code" in accordance with various embodiments of the present disclosure.

FIG. 9B illustrates an exemplary timing diagram 900 of accumulator 320 during an overflow or underflow after the injection of "pre-set code" in accordance with various embodiments of the present disclosure. Timing diagram 900 has an x-axis that represents time and a y-axis that represents the various signals of accumulator 320. At time 952, accumulator 320 experiences either overflow or underflow and is injected with "pre-set code" when the event is triggered. At the same time corresponding to time 920, with the "pre-set code" the edge misalignment is avoided. In other words, at time 952, the edges of the controlling oscillator frequency, CKV, and the realignment clock signal, $RL_P$, align and there is no unpredictable jitter or frequency jumping.

Figure 10:
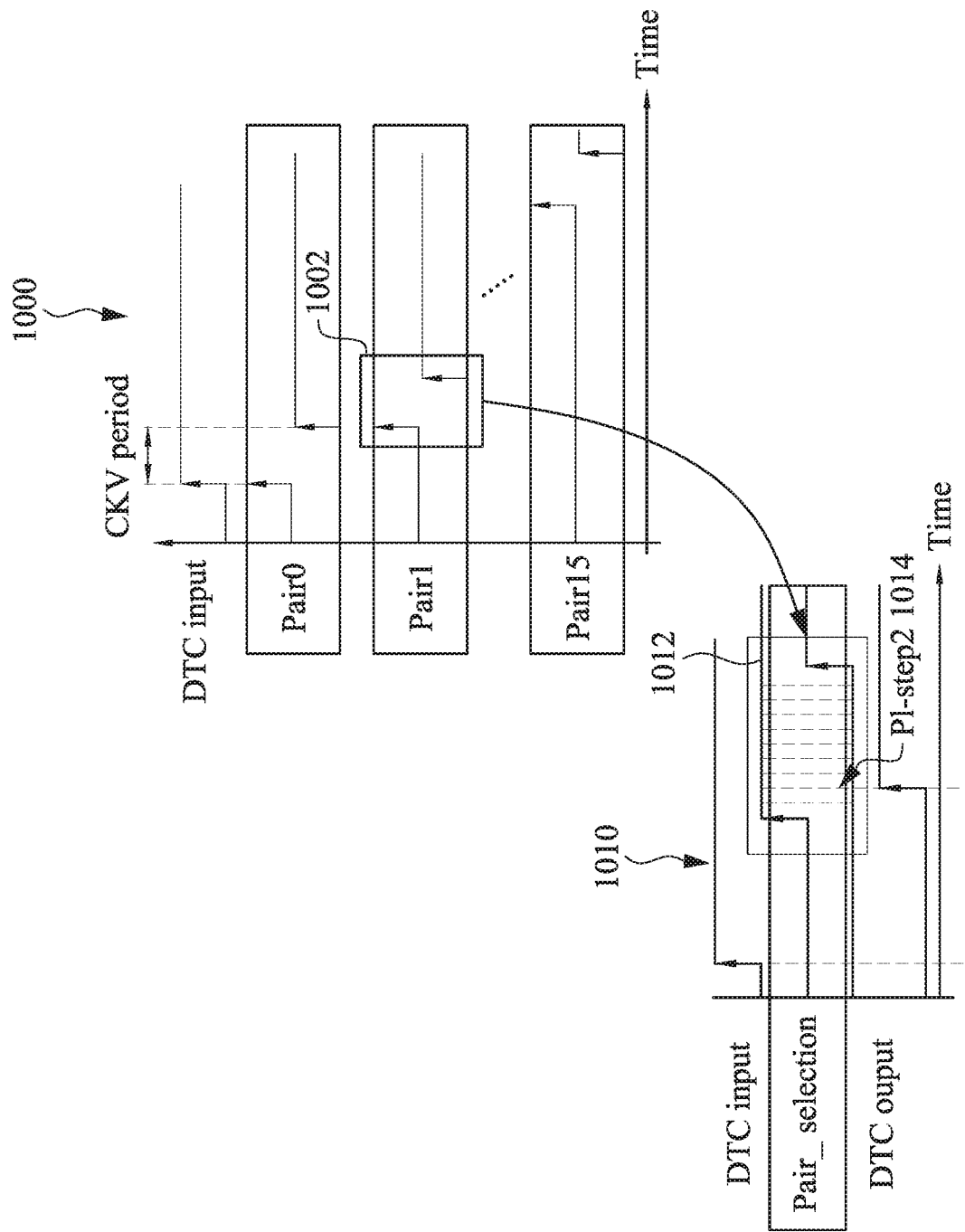
FIG. 10 illustrates exemplary plots illustrating the operation of the digital-to-time converter of FIG. 5.

FIG. 10 illustrates exemplary plots 1000, 1010 illustrating the operation of DTC 500 of FIG. 5. As described in FIG. 5, DTC 120 is used to adjust the period of the realignment clock signal, $RP_L$. The latency of the delay cells 511 within the delay train 510 are programmed as having a frequency of the controlling oscillator frequency, CKV. The input and output of each delay cell 511 are provided to DTC multiplexer 520. For example, as illustrated in plot 1000, pairo has a latency of approximately 1 CKV and pairs has a latency of approximately 2 CKV. DTC multiplexer 520 receives a coarse tuning word, COAR, from accumulating phase adjuster 156. If the coarse tuning word is "high" or "1", the output of the DTC multiplexer 520 (e.g., pair_selection in plot 1010) is pairs (e.g., signals 1002). DTC phase interpolator 530 divides the pair_selection into approximately 10 steps as illustrated in section 1012. If the desired delay for the output of DTC 120 (e.g., clock signal $FREQ_{A,j}$), DTC 120 will select the second step 1014 of signals within section 1012.

Figure 11:
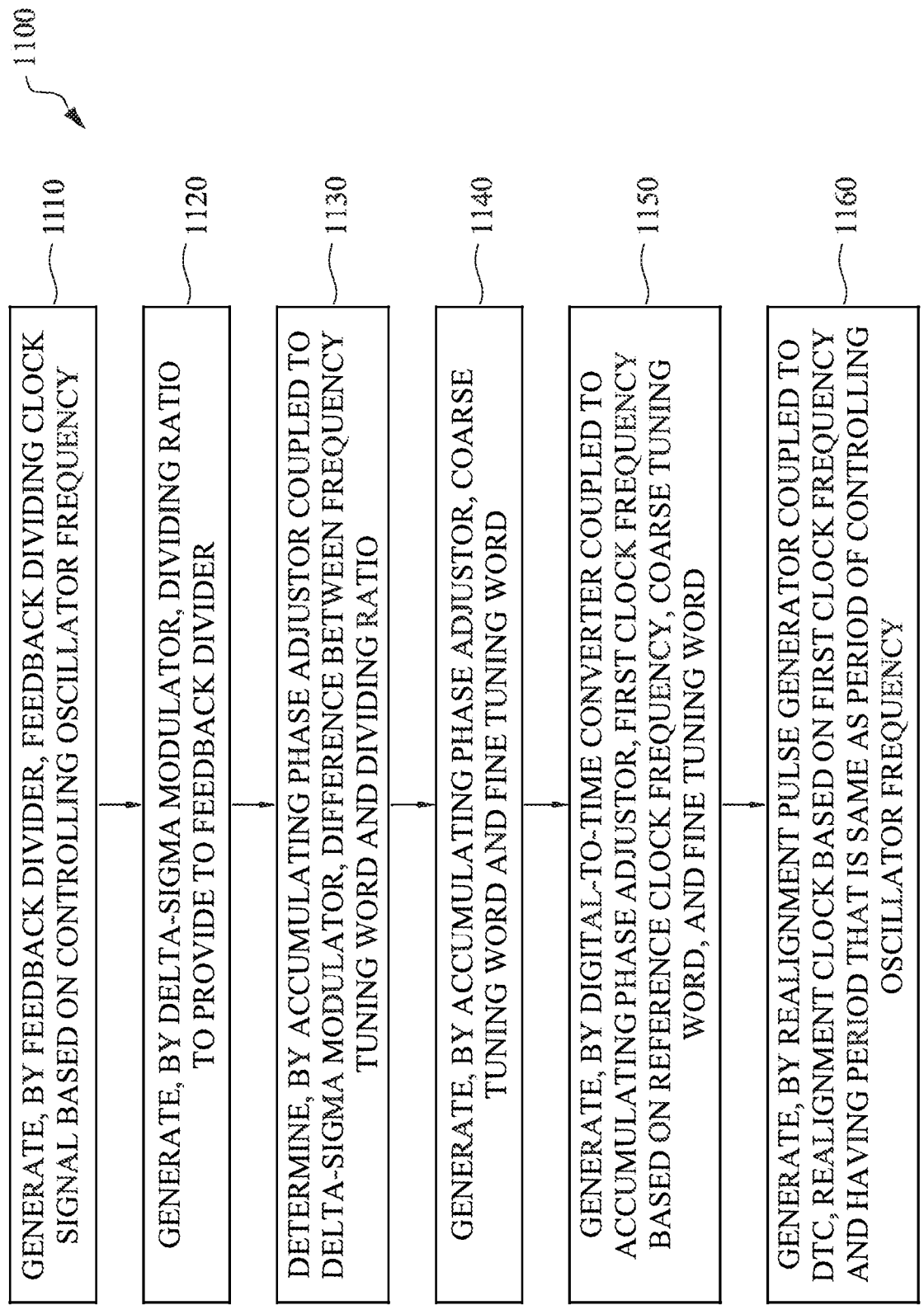
FIG. 11 is a flow chart of an exemplary method of fractional realignment in accordance with various embodiments of the present disclosure.

FIG. 11 is a flow chart 1100 of an exemplary method of fractional realignment in accordance with various embodiments of the present disclosure. The method is applicable to a wide variety of underlying structures. But for ease of understanding, the steps of FIG. 11 are described with reference to structures depicted in FIGS. 1-5. The fractional alignment process includes generating, at 1110, by a feedback divider, a feedback dividing clock signal based on a controlling oscillator frequency. Generating, at 1120, by a delta-sigma modulator coupled to the feedback divider, a dividing ratio and providing the dividing ratio to the feedback divider. Determining, at 1130, by an accumulating phase adjustor coupled to the delta-sigma modulator, a difference between a FCW and the dividing ratio and generating, at 1140, a coarse tuning word and a fine tuning word. Generating, at 1150, by a DTC coupled to the accumulating phase adjustor, a first clock frequency based on a reference clock frequency, the coarse tuning word, and the fine tuning word. Generating, at 1160, by a realignment pulse generator coupled to the DTC, a realignment clock based on the first clock frequency having a period that is the same as a period of the controlling oscillator frequency.

Use of the various circuits and configurations as described herein can provide a number of advantages. For example, when a PLL operates in fractional-N mode there is increased jitter performance as the phase noise generated by the oscillator within the PLL is eliminated. Because the realignment functions with fractional-N mode, switching operation between fractional-N mode and integer-N mode becomes easy.

In one embodiment, a device for fractional realignment includes a feedback divider, a delta-sigma modulator, an accumulating phase adjustor, a DTC, a realignment pulse generator. The feedback divider is configured to generate a feedback dividing clock signal based on a controlling oscillator frequency. A delta-sigma modulator generates a dividing ratio to provide to the feedback divider. The accumulating phase adjustor is coupled to the delta-sigma modulator and configured to (i) determine a difference between a frequency tuning word (FCW) and the dividing ratio and (ii) generate a coarse tuning word and a fine tuning word. The DTC is coupled to the accumulating phase adjustor and configured to generate a first clock frequency based on a reference clock frequency, the coarse tuning word, and the fine tuning word. The realignment pulse generator is coupled to the DTC and configured to generate a realignment clock based on the first clock frequency having a period that is the same as a period of the controlling oscillator frequency.

In another embodiment, a method for fractional realignment includes generating, by a feedback divider, a feedback dividing clock signal based on a controlling oscillator frequency. A delta-sigma modulator generates a dividing ratio to provide to the feedback divider. An accumulating phase adjustor coupled to the delta-sigma modulator determines a difference between a FCW and the dividing ratio. The accumulating phase adjustor generates a coarse tuning word and a fine tuning word. A DTC generates coupled to the accumulating phase adjustor, a first clock frequency based on a reference clock frequency, the coarse tuning word, and the fine tuning word. A realignment pulse generator coupled to the DTC generates a realignment clock based on the first clock frequency having a period that is the same as a period of the controlling oscillator frequency.

In yet another embodiment, a system for fractional realignment includes a feedback divider, a delta-sigma modulator, an accumulating phase adjustor, a DTC, and a realignment pulse generator. The feedback divider is configured to generate a feedback dividing clock signal based on a controlling oscillator frequency. The delta-sigma modulator is coupled to the feedback divider and configured to generate a dividing ratio to provide to the feedback divider. The accumulating phase adjustor is coupled to the delta-sigma modulator and configured to (i) determine a difference between a FCW and the dividing ratio and (ii) generate a coarse tuning word and a fine tuning word. The DTC is coupled to the accumulating phase adjustor and configured to generate a first clock frequency based on a reference clock frequency, the coarse tuning word, and the fine tuning word. The realignment pulse generator is coupled to the DTC and configured to generate a realignment clock based on the first clock frequency having a period that is the same as a period of the controlling oscillator frequency. The reference clock frequency is the source of the realignment clock signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device for fractional realignment, the circuit comprising:
   a feedback divider configured to generate a feedback dividing clock signal based on a controlling oscillator frequency;
   a delta-sigma modulator coupled to the feedback divider and configured to generate a dividing ratio to provide to the feedback divider based on the feedback dividing clock signal;
   an accumulating phase adjustor coupled to the delta-sigma modulator, the accumulating phase adjustor configured to (i) determine a difference between a frequency tuning word (FCW) and the dividing ratio and (ii) generate a coarse tuning word and a fine tuning word;
   a digital-to-time converter (DTC) coupled to the accumulating phase adjustor, the DTC configured to generate a first clock frequency based on a reference clock frequency, the coarse tuning word, and the fine tuning word; and
   a realignment pulse generator coupled to the DTC, the realignment pulse generator configured to generate a realignment clock based on the first clock frequency having a period that is the same as a period of the controlling oscillator frequency.

2. The device of claim 1, further comprising:
   an oscillator coupled to the feedback divider, the oscillator configured to generate the controlling oscillator frequency; and
   a delayed-lock loop (DLL) coupled to the DTC, the DLL configured to determine a period of the oscillator.

3. The device of claim 2, wherein the feedback dividing circuit, the oscillator, the DLL, the delta-sigma modulator, the DTC, and the realignment pulse generator perform operations characterized by:

$$ACC_n = ACC_{n+1} + (\text{DIV\_FROM\_DSM}_n - FCW)$$

where n represents time, ACC is an output of the accumulated phase adjustor, DIV_FROM_DSM is a combination of the dividing ratio and the FCW, and FCW is the frequency tuning word.

4. The device of claim 1, wherein the frequency tuning word comprises a fractional component and an integer component.

5. The device of claim 1, wherein the accumulating phase adjustor comprises:
a fraction subtraction block configured to identify the difference between the FCW and the dividing ratio;
an accumulator coupled to the fraction subtraction block, the accumulator configured to collect timings of operational cycles of the feedback dividing circuit, the oscillator, the DLL, the delta-sigma modulator, the DTC, and the realignment pulse generator;
a sign-to-unsign block couple to the accumulator, the sign-to-unsign block configured to generate an adjusted output;
a decoder block coupled to the sign-to-unsign block, the decoder block configured to generate the coarse tuning word and the fine tuning word based on the adjusted output of the sign-to-unsign block;
a reset block coupled between the accumulator and the fraction subtraction block, the reset block configured to inject pre-set code into the accumulator to replace existing numerals within the accumulator; and
an overflow/underflow detector coupled to the reset block and the accumulator, the overflow/underflow detector configured to provide the reset block with a detection signal signifying whether an overflow event or an underflow event has occurred within the accumulator.

6. The device of claim 5, wherein the reset block and the overflow/underflow detector form a protection circuit, and operation of the protection circuit is characterized by the following equation:

$$ACC_n = ACC_{n+1} + \left\{ \left[ \text{Round\_down}\left( \frac{FCW_{INT}}{4} \right) + 1 \right] * 40 + (FCW_{INT} + FCW_{FRAC}) * 10 \right] + 80 \right\}$$

where ACC is an output of the accumulated phase adjustor, n represents time, $FCW_{INT}$ is an integer component of the frequency tuning word, and $FCW_{FRAC}$ is a fractional component of the frequency tuning word.

7. The device of claim 1, wherein the DTC modified a period of the reference clock frequency.

8. The device of claim 1, wherein the DTC comprises:
a delay train having one or more delay elements configured to introduce latency within an input signal of the DTC;
a clock multiplexer configured to select a clock pair from the delay train for integer latency selection; and
a phase interpolator configured to select a fraction interval from the output of the clock multiplexer.

9. The device of claim 1, wherein the reference clock frequency is the source of the realignment clock signal.

10. A method for fractional realignment comprising:
generating, by a feedback divider, a feedback dividing clock signal based on a controlling oscillator frequency;
generating, by a delta-sigma modulator, a dividing ratio to provide to the feedback divider based on the feedback dividing clock signal;
determining, by an accumulating phase adjustor coupled to the delta-sigma modulator, a difference between a frequency tuning word (FCW) and the dividing ratio;
generating, by the accumulating phase adjustor, a coarse tuning word and a fine tuning word;
generating, by a digital-to-time converter (DTC) coupled to the accumulating phase adjustor, a first clock frequency based on a reference clock frequency, the coarse tuning word, and the fine tuning word; and
generating, by a realignment pulse generator coupled to the DTC, a realignment clock based on the first clock frequency having a period that is the same as a period of the controlling oscillator frequency.

11. The method of claim 10, further comprising:
generating, by an oscillator coupled to the feedback divider, the controlling oscillator frequency; and
determining, by a delayed-lock loop (DLL) coupled to the DTC, a period of the oscillator.

12. The method of claim 11, wherein the feedback dividing circuit, the oscillator, the DLL, the delta-sigma modulator, the DTC, and the realignment pulse generator perform operations characterized by:

$$ACC_n = ACC_{n+1} + (\text{DIV\_FROM\_DSM}_n - FCW)$$

where n represents time, ACC is an output of the accumulated phase adjustor, DIV_FROM_DSM is a combination of the dividing ratio and the FCW, and FCW is the frequency tuning word.

13. The method of claim 10, wherein the frequency tuning word comprises a fractional component and an integer component.

14. The method of claim 10, wherein the accumulating phase adjustor performs operations comprising:
identifying, by a fraction subtraction block, the difference between the FCW and the dividing ratio;
collecting, by an accumulator coupled to the fraction subtraction block, timings of operational cycles of the feedback dividing circuit, the oscillator, the DLL, the delta-sigma modulator, the DTC, and the realignment pulse generator;
generating, by a sign-to-unsign block couple to the accumulator, an adjusted output;
generating, by a decoder block coupled to the sign-to-unsign block, the coarse tuning word and the fine tuning word based on the adjusted output of the sign-to-unsign block;
injecting, by a reset block coupled between the accumulator and the fraction subtraction block, pre-set code into the accumulator to replace existing numerals within the accumulator; and
providing, by an overflow/underflow detector coupled to the reset block and the accumulator, the reset block with a detection signal signifying whether an overflow event or an underflow event has occurred within the accumulator.

15. The method of claim 14, wherein the reset block and the overflow/underflow detector form a protection circuit, and operation of the protection circuit is characterized by the following equation:

$$ACC_n = ACC_{n+1} + \left\{\left[\left[\text{Round\_down}\left(\frac{FCW_{INT}}{4}\right)+1\right]*40 + (FCW_{INT}+FCW_{FRAC})*10\right]+80\right\}$$

where ACC is an output of the accumulated phase adjustor, n represents time, $FCW_{INT}$ is an integer component of the frequency tuning word, and $FCW_{FRAC}$ is a fractional component of the frequency tuning word.

16. The method of claim 10, wherein the DTC modified a period of the reference clock frequency.

17. The method of claim 10, wherein the DTC performs operations comprising:
   introducing, by a delay train having one or more delay elements, latency within an input signal of the DTC;
   selecting, by a clock multiplexer, a clock pair from the delay train for integer latency selection; and
   selecting, by a phase interpolator, a fraction interval from the output of the clock multiplexer.

18. The method of claim 10, wherein the reference clock frequency is the source of the realignment clock signal.

19. A system for fractional realignment comprising:
   a feedback divider configured to generate a feedback dividing clock signal based on a controlling oscillator frequency;
   a delta-sigma modulator coupled to the feedback divider and configured to generate a dividing ratio to provide to the feedback divider based on the feedback dividing clock signal;
   an accumulating phase adjustor coupled to the delta-sigma modulator, the accumulating phase adjustor configured to (i) determine a difference between a frequency tuning word (FCW) and the dividing ratio and (ii) generate a coarse tuning word and a fine tuning word;
   a digital-to-time converter (DTC) coupled to the accumulating phase adjustor, the DTC configured to generate a first clock frequency based on a reference clock frequency, the coarse tuning word, and the fine tuning word; and
   a realignment pulse generator coupled to the DTC, the realignment pulse generator configured to generate a realignment clock based on the first clock frequency having a period that is the same as a period of the controlling oscillator frequency, wherein the reference clock frequency is the source of the realignment clock signal.

20. The system of claim 19, further comprising:
   an oscillator coupled to the feedback divider, the oscillator configured to generate the controlling oscillator frequency; and
   a delayed-lock loop (DLL) coupled to the DTC, the DLL configured to determine a period of the oscillator.

* * * * *